United States Patent
Choi et al.

(10) Patent No.: US 9,324,967 B2
(45) Date of Patent: Apr. 26, 2016

(54) METHOD OF MANUFACTURING ORGANIC LIGHT-EMITTING DISPLAY APPARATUS

(71) Applicant: Samsung Display Co., Ltd., Yongin (KR)

(72) Inventors: Jai-Hyuk Choi, Yongin (KR); Jin-Woo Park, Yongin (KR); Ung-Soo Lee, Yongin (KR); Su-Hyuk Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/061,421

(22) Filed: Oct. 23, 2013

(65) Prior Publication Data
US 2015/0028291 A1    Jan. 29, 2015

(30) Foreign Application Priority Data
Jul. 25, 2013 (KR) .................. 10-2013-0088272

(51) Int. Cl.
| H01L 51/56 | (2006.01) |
| H01L 33/52 | (2010.01) |
| H01L 33/56 | (2010.01) |
| H01L 51/52 | (2006.01) |
| H01L 27/32 | (2006.01) |

(52) U.S. Cl.
CPC ......... *H01L 51/5253* (2013.01); *H01L 27/3244* (2013.01); *H01L 33/52* (2013.01); *H01L 33/56* (2013.01)

(58) Field of Classification Search
CPC .............. H01L 51/524; H01L 27/3244; H01L 51/5253; H01L 51/56; H01L 33/52; H01L 33/56
USPC .......................................................... 438/26
See application file for complete search history.

(56) References Cited

U.S. PATENT DOCUMENTS

| 6,195,142 B1 * | 2/2001 | Gyotoku et al. ................. 349/69 |
| 6,943,380 B2 * | 9/2005 | Ota et al. ...................... 257/100 |
| 7,038,246 B2 * | 5/2006 | Uemura .......................... 257/98 |
| 7,429,750 B2 * | 9/2008 | Suehiro et al. .................. 257/53 |
| 7,615,506 B2 | 11/2009 | Aitken et al. |
| 7,714,333 B2 * | 5/2010 | Suehiro et al. .................. 257/79 |
| 7,722,929 B2 * | 5/2010 | Aitken et al. ............. 427/376.1 |
| 7,732,002 B2 * | 6/2010 | Kodas et al. .................... 427/58 |
| 7,824,937 B2 * | 11/2010 | Suehiro et al. .................. 438/26 |

(Continued)

FOREIGN PATENT DOCUMENTS

| JP | 2010-177548 | * 8/2010 | ............. H01L 33/48 |
| JP | 2011-126722 | * 6/2011 | ............. H01L 31/04 |

(Continued)

OTHER PUBLICATIONS

Partial Translation of JP 2011-126722.*

*Primary Examiner* — Mary Wilczewski

(74) *Attorney, Agent, or Firm* — H.C. Park & Associates, PLC

(57) ABSTRACT

A method of manufacturing an organic light-emitting display apparatus includes disposing a low melting glass (LMG) thin film to cover a display unit disposed on a substrate, and radiating an energy beam onto the LMG thin film. Accordingly, an encapsulation layer having excellent sealing characteristics may be rapidly formed, and thus manufacturing process efficiency and product reliability may be improved.

15 Claims, 2 Drawing Sheets

(56) References Cited

U.S. PATENT DOCUMENTS

| | | | |
|---|---|---|---|
| 7,859,006 B2 * | 12/2010 | Kato et al. | 257/100 |
| 7,872,417 B2 * | 1/2011 | Nakamura et al. | 313/512 |
| 8,115,326 B2 * | 2/2012 | Aitken et al. | 257/790 |
| 8,174,045 B2 * | 5/2012 | Matsumoto | C03C 3/16 257/100 |
| 8,435,605 B2 * | 5/2013 | Aitken et al. | 427/376.1 |
| 8,623,469 B2 * | 1/2014 | Shimomura et al. | 427/554 |
| 8,685,766 B2 * | 4/2014 | Suehiro et al. | 438/26 |
| 8,686,465 B2 * | 4/2014 | Matsumoto | C03C 3/16 257/100 |
| 8,759,840 B2 * | 6/2014 | Kato et al. | 257/79 |
| 8,816,336 B2 * | 8/2014 | Shimomura | 257/40 |
| 2003/0017658 A1 * | 1/2003 | Nishitani et al. | 438/149 |
| 2003/0183915 A1 * | 10/2003 | Scheifers et al. | 257/682 |
| 2003/0207500 A1 * | 11/2003 | Pichler et al. | 438/127 |
| 2004/0206953 A1 * | 10/2004 | Morena et al. | 257/40 |
| 2004/0207314 A1 * | 10/2004 | Aitken et al. | 313/504 |
| 2007/0252526 A1 * | 11/2007 | Aitken et al. | 313/512 |
| 2008/0111261 A1 * | 5/2008 | Torinari | 264/1.37 |
| 2008/0146431 A1 * | 6/2008 | Aitken | C03C 8/24 501/44 |
| 2008/0226900 A1 * | 9/2008 | Nagai | C03C 17/02 428/333 |
| 2009/0146923 A1 * | 6/2009 | Takaura et al. | 345/60 |
| 2010/0065882 A1 * | 3/2010 | Matsumoto | C03C 3/16 257/99 |
| 2010/0193353 A1 | 8/2010 | Aitken et al. | |
| 2010/0252858 A1 * | 10/2010 | Matsumoto | C03C 3/16 257/100 |
| 2011/0020587 A1 | 1/2011 | Aitken et al. | |
| 2011/0201725 A1 * | 8/2011 | Endo | C03C 3/16 523/451 |
| 2011/0249221 A1 * | 10/2011 | Uchida | G02B 6/005 349/65 |
| 2012/0028011 A1 * | 2/2012 | An et al. | 428/213 |
| 2012/0156827 A1 * | 6/2012 | Michael et al. | 438/95 |
| 2012/0187448 A1 * | 7/2012 | Matsumoto | C03C 3/16 257/100 |
| 2012/0313055 A1 * | 12/2012 | Yukinobu et al. | 252/519.5 |
| 2013/0134396 A1 * | 5/2013 | Shimomura et al. | 257/40 |
| 2013/0164486 A1 * | 6/2013 | Yamada et al. | 428/76 |
| 2013/0300284 A1 * | 11/2013 | Nishido | 313/511 |
| 2014/0023803 A1 * | 1/2014 | Kawanami et al. | 428/34 |
| 2014/0116614 A1 * | 5/2014 | Fukai et al. | 156/272.8 |
| 2014/0144772 A1 * | 5/2014 | Bellman | C23C 14/34 204/192.15 |
| 2014/0314969 A1 * | 10/2014 | Singh et al. | 428/1.51 |
| 2015/0028291 A1 * | 1/2015 | Choi | H01L 51/5253 257/40 |
| 2015/0091011 A1 * | 4/2015 | Sugitani | H01L 27/124 257/72 |

FOREIGN PATENT DOCUMENTS

| | | | | |
|---|---|---|---|---|
| JP | 2012-31001 | * | 2/2012 | C03C 8/08 |
| KR | 2005028543 | * | 3/2005 | C03C 3/066 |
| KR | 10-2008-0045217 | | 5/2008 | |
| KR | 10-2010-0029774 | | 3/2010 | |
| KR | 10-2010-0050470 | | 5/2010 | |
| WO | WO 2008/146886 | * | 12/2008 | H01L 33/00 |

* cited by examiner

METHOD OF MANUFACTURING ORGANIC LIGHT-EMITTING DISPLAY APPARATUS

CROSS-REFERENCE TO RELATED APPLICATIONS

This application claims priority from and the benefit of Korean Patent Application No. 10-2013-0088272, filed on Jul. 25, 2013, which is hereby incorporated by reference for all purposes as if fully set forth herein.

BACKGROUND

1. Field

The present disclosure relates to methods of manufacturing organic light-emitting display apparatuses, and, more particularly, to methods of manufacturing organic light-emitting display apparatuses having sealing characteristics.

2. Discussion of the Background

An organic light-emitting display apparatus is a self-luminous display apparatus and may include one or more organic light-emitting devices, e.g., organic light-emitting diodes, each including a hole injection electrode, an electron injection electrode, and an organic emission layer provided therebetween. An exciton is generated when a hole injected from the hole injection electrode is recombined with an electron injected from the electron injection electrode in the organic emission layer. Light is emitted when the exciton falls from an excited state to a ground state.

Since the organic light-emitting display apparatus is a self-luminous display apparatus, a separate light source, such as a backlight unit for a liquid crystal display device, may not be essential for the organic light-emitting display apparatus. Therefore, the organic light-emitting display apparatus may be driven at a lower voltage and be manufactured as a device having a light weight and a slim profile. In addition, the organic light-emitting display apparatus has high-grade characteristics, such as wide viewing angles, high contrast, and fast response times. Accordingly, the organic light-emitting display apparatus is generally considered as a next-generation display apparatus.

However, since the organic light-emitting device is vulnerable to the external environment, for example, oxygen or moisture, there is a need for a sealing structure that seals the organic light-emitting device from the external environment.

Because of the vulnerability of the organic light-emitting device, the productivity, endurance, and quality of organic light-emitting devices may depend on the quality of the sealing structure for the organic light-emitting devices.

SUMMARY

Exemplary embodiments of the present invention provide methods of manufacturing organic light-emitting display apparatuses having a sealing structure. The organic light-emitting display apparatuses may have a sealing structure including an encapsulation layer formed of a low melting material, e.g., a low melting glass, for rapid and efficient layer formation. According to an exemplary embodiment, a method of manufacturing a sealing structure is improved to rapidly and efficiently form an encapsulation layer having excellent sealing characteristics.

Additional aspects will be set forth in part in the description which follows and, in part, will be apparent from the description, or may be learned by practice of the presented embodiments.

According to exemplary embodiments, a method of manufacturing an organic light-emitting display apparatus includes disposing a low melting glass (LMG) thin film to cover a display unit disposed on a substrate, and radiating an energy beam onto the LMG thin film.

According to exemplary embodiments, a method of manufacturing a sealing structure using a low melting material includes disposing a low melting material to seal a sealing object disposed on a substrate, and radiating an energy beam onto the low melting material to heat an exposed surface of the low melting material to a heating temperature at or above a transition temperature of the low melting material. The low melting material has the transition temperature lower than a transition temperature of silicon dioxide ($SiO_2$).

According to exemplary embodiments, an organic light-emitting display apparatus includes a substrate, an organic light-emitting device disposed on the substrate, and a low melting glass (LMG) thin film disposed on the organic light-emitting device to seal the organic light-emitting device. The LMG thin film includes a sealing layer that corresponds to an energy-beam-irradiated portion of the LMG thin film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
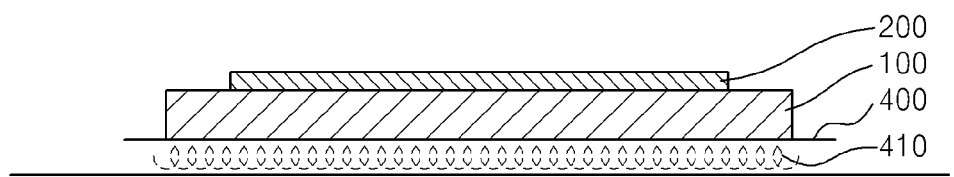
FIG. 1, FIG. 2, FIG. 3, and FIG. 4 are cross-sectional views illustrating a method of manufacturing an organic light-emitting display apparatus, according to an exemplary embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

The embodiments described hereinafter are exemplary, and various changes and modifications may be made. Further, when a layer is referred to as being "on" another layer or substrate, it may be directly on the other layer or substrate, or one or more intervening layers may also be present therebetween. Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms "a", "an", and "the" are intended to include the plural forms as well, unless the context clearly indicates otherwise. It will be further understood that the terms "comprises," "includes," "including," and/or "comprising," when used herein, specify the presence of stated features, components, groups, elements, steps, operations, and/or devices thereof, but do not preclude the presence or addition of one or more other features, components, groups, elements, steps, operations, and/or devices thereof.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

According to implementations and/or modifications from exemplary embodiments, a specific process order may be performed differently from the described order. For example, two consecutively described processes may be performed substantially at the same time or performed in an order opposite to the described order.

FIG. 1 to FIG. 4 are cross-sectional views illustrating a method of manufacturing an organic light-emitting display apparatus, according to an exemplary embodiment of the present invention. FIG. 5 is an enlarged cross-sectional view of region A in FIG. 4, according to an exemplary embodiment of the present invention.

Referring to FIG. 1, a display unit 200 may be formed on a substrate 100.

The substrate 100 may be a hard glass substrate, but is not limited thereto. The substrate 100 may be a metal or plastic substrate. For example, the substrate 100 may be a flexible substrate formed of a flexible material, such as polyimide.

The display unit 200 is provided for implementing an image. As illustrated in FIG. 5, the display unit 200 may include an organic light-emitting device 220 in which a first electrode 221, an organic emission layer 223, and a second electrode 222 are sequentially stacked on the substrate 100. The display unit 200 may also include a thin film transistor TR connected to the first electrode 221 of the organic light-emitting device 220. An exemplary detailed structure of the display unit 200 will be described later with reference to FIG. 5. Throughout the specification, the display unit 200 may be illustrated as including an organic light-emitting device 220; however, other types of display devices, components, circuits may be sealed as well, according to methods described herein.

Figure 2:
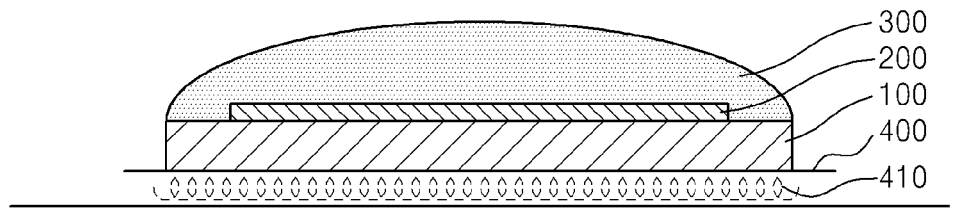

After forming the display unit 200 on the substrate 100, a low melting material, e.g., a low melting glass (LMG) thin film 300, may be formed as an encapsulation layer covering the display unit 200, as illustrated in FIG. 2. The LMG thin film 300 may cover the entire display unit 200 such that the sealing object (e.g., the display unit 200) is isolated or sealed from external environment, e.g., moisture, outside air, oxygen, and the like. The LMG thin film 300 is formed of an LMG material having a low glass transition temperature.

The term "glass transition temperature" refers to a minimum temperature at which fluidity may be provided to the LMG thin film 300. The glass transition temperature may be a temperature at which an amorphous solid becomes soft upon heating or brittle upon cooling or may be a temperature range in which an amorphous solid changes to another state. The glass transition temperature of the LMG thin film 300 is about 250° C. to about 400° C. The glass transition temperature of the LMG thin film 300 is much lower than the transition temperature (about 1200° C.) of $SiO_2$, which is a general glass material, but is higher than the metamorphic temperature of a material included in the display unit 200 and/or a material included in the substrate 100. Therefore, when the entire LMG thin film 300 is heated to a glass transition temperature or a higher temperature, the display unit 200 is directly exposed to a condition beyond a metamorphic temperature and thus its characteristics may be easily degraded or damaged. However, if the surface of the LMG thin film 300 is heated for a short amount of time at a glass transition temperature or a higher temperature, the LMG thin film 300 may temporarily maintains the glass transition temperature or a higher temperature without degrading the characteristics of the components of the display unit 200 and/or the substrate 100. However, since the surface of the LMG thin film 300 is heated for a short amount of time, e.g., a few seconds, which is enough to change, from the solid state, the exposed surface of the LMG thin film 300 to tightly seal the display unit 200, the degradation of the display unit 200 may be prevented. According to an exemplary embodiment, since an energy beam is radiated onto the surface of the LMG thin film 300 for certain amount of time, the degradation of the display unit 200 is prevented and the surface of the LMG thin film 300 may be heated to the glass transition temperature or a slightly higher temperature. If the energy beam is radiated onto a portion of the LMG thin film 300 for certain amount of time at the glass transition temperature or a higher temperature, the irradiated portion may become soft enough to seal the defects of the portion of the LMG thin film 300 to enhance a sealing of the display unit 200 and/or a portion of the substrate 100 while other portions, e.g., the display unit 200, may be less heated. Examples of the process will be described below in more detail. If the exposed surface of the LMG thin film 300 is heated by a heating element, e.g., an energy beam, to a temperature at or above the glass transition temperature, the exposed surface of the LMG thin film 300 may change from a solid state to form an enhanced sealing layer, e.g., a compact oxide film 310.

The LMG thin film 300 may be formed of a single compound or a mixture of two or more kinds of compounds. For example, the LMG thin film 300 may be formed of tin oxide, e.g., stannous oxide (SnO). The LMG thin film 300 may further include at least one of $P_2O_5$, tungsten (W), boron (B), niobium (Nb), $TiO_2$, ZnO, $SiO_2$, BaO, $Al_2O_3$, and $B_2O_3$. For example, the LMG thin film 300 may be formed of a composition of tin phosphate glass (SnO-$P_2O_5$).

The LMG thin film 300 may be formed by sputtering, evaporation, chemical vapor deposition (CVD), pulsed laser deposition (PLD), or plasma spraying, and may be formed to have a thickness of about 1 μm to about 30 μm. Further, the LMG thin film 300 may be formed to have a thickness of about 0.1 μm to about 30 μm if a structure having a thinner LMG thin film is to be implemented. In the implementation of a flexible structure, the LMG thin film 300 may be formed to have a thickness of about 1 μm to about 5 μm. Further, the LMG thin film 300 may be formed to have a thickness of about 0.1 μm to about 5 μm if a flexible structure having a thinner LMG thin film is to be implemented.

Figure 3:
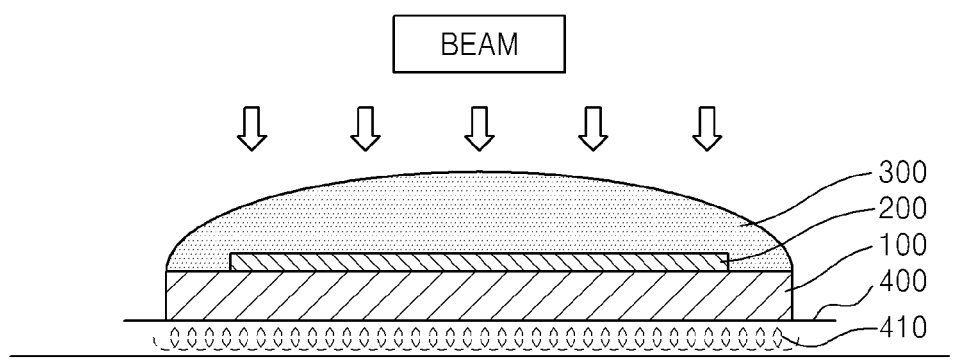

After forming the LMG thin film 300, an energy beam may be radiated onto the LMG thin film 300, as illustrated in FIG. 3. The energy beam may be a laser beam, an electron beam, an ion beam, a neutron beam, a plasma beam, or a pulsed laser beam, and may be a beam having a wavelength band in which the emitted energy is effectively absorbed by the main material of the LMG thin film 300, e.g., SnO. For example, one of an infrared band and an ultraviolet band or both bands may be utilized for SnO such that the LMG thin film 300 absorbs the emitted energy well.

When the energy beam is radiated onto the LMG thin film 300, the surface of the LMG thin film 300 may be heated to a glass transition temperature or a higher temperature to provide the fluidity to seal the display unit 200 while preventing the degradation of the characteristics of the display unit 200. The heated LMG thin film 300 flows to make up for its surface defect. More specifically, the surface defect, which may be caused by some non-uniform deposition made in a deposition process, may disappear or be reduced through the energy beam radiation, and thus sealing characteristics that prevent the penetration of oxygen or moisture from the outside may be further improved. Further, a portion of the heated LMG thin film 300 becomes soft to tightly seal dents, gaps, and holes of the LMG thin film 300, and the deposited LMG thin film 300 may tightly seal the periphery of the substrate 100 attached to the LMG thin film 300.

Figure 4:
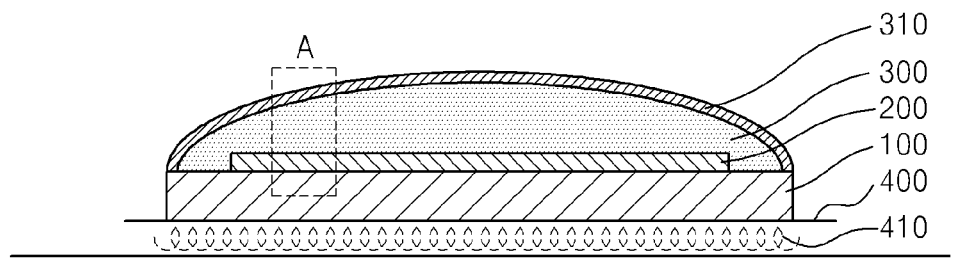
Figure 5:
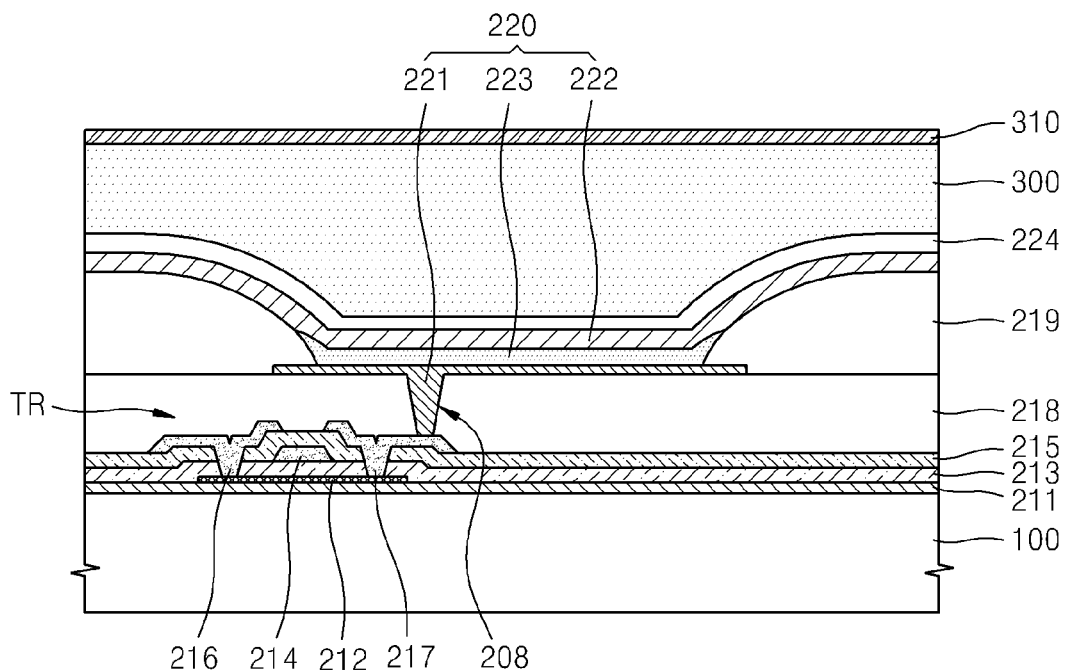
FIG. 5 is a cross-sectional view illustrating a detailed structure of region A in FIG. 4, according to an exemplary embodiment of the present invention.

Further, oxidation of the surface of the LMG thin film 300 is accelerated by the energy beam radiation, and SnO is oxidized into $SnO_2$ to form a compact oxide film 310 on the surface thereof, as illustrated in FIG. 4. More specifically, when the LMG thin film 300 has an original composition of SnO+$P_2O_5$, an oxide film 310 having a composition of $SnO_2$+$P_2O_5$ is formed on the surface thereof. Since the compact oxide film 310 is formed on the surface of the LMG thin film 300, sealing characteristics that protect the display unit 200 from outside air may be further improved. The oxidation may also progress naturally in an oxygen atmosphere. However, an oxidation rate is too low in the natural oxidation process, thus reducing productivity. Furthermore, the deposited LMG thin film 300 may not tightly seal the display unit 200 in the natural oxidation process. If the energy beam is radiated, however, since the oxidation rate increases considerably, the compact oxide film 310 may be formed quickly by radiating the energy beam for several seconds. Since the compact oxide film 310 is to be formed, the energy beam radiation may well be performed in an oxygen-containing atmosphere. Herein, the oxygen-containing atmosphere is not a 100% oxygen atmosphere, but an atmosphere in which oxygen exists or is mixed with atmospheric gas, such as argon or nitrogen. The energy beam may be generated by a point source or a line source.

As described above, if only the surface of the LMG thin film 300 is temporarily heated to the glass transition temperature or a higher temperature and then cooled, the characteristics of the display unit 200 are hardly degraded. Further, in order to avoid or prevent the degradation of the characteristics of the display unit 200 in a more effective and secure manner, as illustrated in FIG. 3, a cooling line 410 may be installed at a stage, on which the substrate 100 is disposed, to cool the substrate 100 during the energy beam radiation. The substrate 100 and/or the display unit 200 may be cooled during the heating of the LMG thin film 300 by the energy beam radiation, thereby preventing the display unit 200 from being metamorphosed, degraded, or damaged by heat. By doing so, a strong encapsulation layer having a reduced defect LMG thin film 300 and a compact oxide film 310 may be formed securely.

Accordingly, an encapsulation layer having excellent sealing characteristics may be rapidly formed through the above-described manufacturing method.

Hereinafter, a detailed structure of the display unit 200 will be described with reference to FIG. 5.

As illustrated in FIG. 5, the display unit 200 includes the thin film transistor TR and the organic light-emitting device 220.

A buffer film 211 may be disposed on the substrate 100. The buffer film 211 may prevent impurity ions from being diffused into the top surface of the substrate 100, prevent a penetration of moisture or outside air, and planarize the surface of the substrate 100. For example, the buffer film 211 may be formed of an inorganic material, such as silicon oxide, silicon nitride, silicon oxynitride, aluminum oxide, aluminum nitride, titanium oxide, or titanium nitride, and/or an organic material, such as polyimide, polyester, or acryl, or a stack of the inorganic material and the organic material.

The thin film transistor TR includes an active layer 212, a gate electrode 214, a source electrode 216, and a drain electrode 217. A gate insulating film 213 may be disposed between the gate electrode 214 and the active layer 212 to insulate the gate electrode 214 from the active layer 212.

The active layer 212 may be disposed on the buffer film 211. The active layer 212 may include an inorganic semiconductor, such as amorphous silicon or polysilicon, or an organic semiconductor. In some embodiments, the active layer 212 may include an oxide semiconductor. For example, the oxide semiconductor may include an oxide of a material selected from Group 12, 13, or 14 metal elements, such as zinc (Zn), indium (In), gallium (Ga), tin (Sn), cadmium (Cd), germanium (Ge), or hafnium (Hf), and any combinations thereof.

The gate insulating film 213 may be disposed on the buffer film 211 to cover the active layer 212, and the gate electrode 214 may be formed on the gate insulating film 213.

An interlayer insulating film 215 may be formed on the gate insulating film 213 to cover the gate electrode 214. The source electrode 216 and the drain electrode 217 may be formed on the interlayer insulating film 215 while portions of the source electrode 216 and the drain electrode 217 are connected to the active layer 212.

The thin film transistor TR is not limited to the above-described structure, and various structures may also be applied to the thin film transistor TR. For example, the thin film transistor TR may have a top gate structure, or may have a bottom gate structure in which the gate electrode 214 is disposed under the active layer 212.

A planarization film 218 may be provided on the interlayer insulating film 215 to cover the thin film transistor TR. The planarization film 218 may include an inorganic material and/or an organic material. For example, the planarization film 218 may include a photoresist, an acryl-based polymer, a polyimide-based polymer, a polyamide-based polymer, a siloxane-based polymer, a polymer including a photosensitive acryl carboxyl group, a novolac resin, an alkali soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, or titanium oxide.

The organic light-emitting device 220 may be disposed on the planarization film 218. The organic light-emitting device 220 includes the first electrode 221, the organic emission layer 220, and the second electrode 222. A pixel definition film 219 may be disposed on the planarization film 218 and the first electrode 221, and defines a pixel region and a non-pixel region.

The organic emission layer 223 may include a low-molecular-weight or high-molecular-weight organic material. In the case of using the low-molecular-weight organic material, a hole injection layer (HIL), a hole transport layer (HTL), an emission layer (EML), an electron transport layer (ETL), and an electron injection layer (EIL) may be stacked in a single or multiple structure. The low-molecular-weight organic material may be formed by a vacuum evaporation. In this case, the emission layer may be independently formed at each of red (R), green (G), and blue (B) pixels. The hole injection layer, the hole transport layer, the electron transport layer, and the electron injection layer may be commonly applied to the red, green, and blue pixels as a common layer. However, aspects are not limited as such.

When the organic emission layer 223 is formed of a high-molecular-weight organic material, only the HTL may be included in a direction toward the first electrode 221 from the emission layer. Further, when the organic emission layer 223 is formed of a high-molecular-weight organic material, the hole transport layer (HTL) may be disposed between the first electrode 221 and the emission layer (EML) while the electron transport layer (ETL) and the electron injection layer (EIL) are disposed on the emission layer (EML). However, aspects are not limited as such. The HTL may be formed on the first electrode 221 by an inkjet printing or a spin coating by using poly-(2,4)-ethylene-dihydroxy thiophene (PEDOT) or polyaniline (PANI). Examples of available organic materials may include high-molecular-weight organic materials based on poly-phenylenevinylene (PPV) and polyfluorene. Color patterns may be formed by a general method, such as an inkjet printing, a spin coating, or a thermal transfer using a laser beam.

The HIL may be formed of a phthalocyanine compound, such as copper phthalocyanine, or starburst-type amine, such as Tris(4-carbazoyl-9-ylphenyl)amine (TCTA), triphenylamine (m-MTDATA), or 1,3,5-tris[4-(3-methylphenylphenylamino)phenyl]benzene (m-MTDAPB).

The HTL may be formed of N,N'-bis(3-methylphenyl)-N,N-diphenyl-[1,1-biphenyl]-4,4'-diamine (TPD), N,N'-di (naphthalene-1-yl)-N,N'-diphenyl benzidine (α-NPD), or the like.

The EIL may be formed of LiF, NaCl, CsF, $Li_2O$, BaO, Liq, or the like.

The ETL may be formed of $Alq_3$.

The emission layer (EML) may include a host material and a dopant.

Examples of the host material may include tris(8-hydroxyquinolinato)aluminum ($Alq_3$), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), and the like.

Examples of the dopant may include 4,4'-bis[4-(di-p-tolylamino)styrl]biphenyl (DPAVBi), 9,10-di(naph-2-tyl)anthracene (ADN), TBADN (3-tert-butyl-9,10-di(naph-2-tyl) anthracene (TBADN), and the like.

The first electrode 221 may be disposed on the planarization film 218 and may be electrically connected to the drain electrode 217 of the thin film transistor TR through a via hole 208 passing through the planarization film 218.

The first electrode 221 and the second electrode 222 may function as an anode electrode and a cathode electrode, respectively, but are not limited thereto. Polarities of the first electrode 221 and the second electrode 222 may be reversed.

The pixel definition film 219 may include an opening exposing the first electrode 221, and define a pixel region and a non-pixel region of the organic light-emitting device 220. Although only one opening is illustrated, the pixel definition film 219 may include a plurality of openings. The first electrode 221, the organic emission layer 220, and the second electrode 222 are sequentially stacked within the opening of the pixel definition film 219, and the organic emission layer 222 is configured to emit light.

When a plurality of openings are formed, the organic light-emitting display apparatus may include a plurality of organic light-emitting devices 220. A single pixel may be formed in each organic light-emitting device 220, and one of a red color, a green color, a blue color, and a white color may be implemented at a pixel. Alternatively, the organic emission layer 223 may be commonly formed on the entire planarization film 218, regardless of the position of the pixel. The organic emission layer 223 may be formed by vertically stacking or combining layers including light-emitting materials that emit red light, green light, and blue light. A combination of other colors may also be applied as long as emission of white light is possible. In addition, the organic light-emitting display apparatus may further include a color filter or a color conversion layer that converts the emitted white light into a predetermined color.

A protection layer 224 may be provided to cover and protect the organic light-emitting device 220. The protection layer 224 may include an inorganic insulating film and/or an organic insulating film. The inorganic insulating film may include $SiO_2$, SiNx, SiON, $Al_2O_3$, $TiO_2$, $Ta_2O_5$, $HfO_2$, $ZrO_2$, BST, or PZT. The organic insulating film may include a general-purpose polymer, such as polymethylmethacrylate (PMMA) and polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinylalcohol-based polymer, and a blend thereof. The protection layer 224 may be deposited by various deposition methods, such as plasma-enhanced chemical vapor deposition (PECVD), atmospheric pressure CVD (APCVD), or low pressure CVD (LPCVD).

The display unit 220 having the above-described configuration may be safely protected by the enhanced sealing characteristics of the LMG thin film 300.

As described above, according to the one or more of the above embodiments of the present invention, an encapsulation layer that has enhanced sealing characteristics and safely protects a display unit may be formed, thus making it possible to improve manufacturing process efficiency and product reliability.

Although certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A method of manufacturing an organic light-emitting display apparatus, comprising:
   disposing a low melting glass (LMG) thin film to cover a display unit disposed on a substrate; and
   radiating an energy beam onto the LMG thin film to heat an exposed surface of the LMG thin film to a heating temperature at or above a glass transition temperature of the LMG thin film,
   wherein the radiating of the energy beam is performed in an oxygen-containing atmosphere, and
   wherein the LMG thin film comprises tin(II) oxide (SnO) and has a glass-transition temperature of about 250° C. to about 400° C.

2. The method of claim 1, wherein the energy beam comprises any one of a laser beam, an electron beam, an ion beam, a neutron beam, a plasma beam, and a pulsed laser beam.

3. The method of claim 1, wherein the energy beam has any one of an infrared wavelength and an ultraviolet wavelength.

4. The method of claim 1, further comprising: cooling the substrate during the radiating of the energy beam.

5. The method of claim 1, wherein a glass transition temperature of the LMG thin film is higher than a metamorphic temperature of the display unit.

6. The method of claim 1, wherein disposing the LMG thin film comprises any one of sputtering, evaporation, chemical vapor deposition (CVD), pulsed laser deposition (PLD), and plasma spraying.

7. The method of claim 1, wherein the substrate comprises a glass substrate.

8. The method of claim 1, wherein the substrate comprises a flexible substrate.

9. A method of manufacturing an organic light-emitting display apparatus, comprising:
   disposing a low melting glass (LMG) thin film to cover a display unit disposed on a substrate;
   radiating an energy beam onto the LMG thin film to heat an exposed surface of the LMG thin film to a heating temperature at or above a glass transition temperature of the LMG thin film, wherein the LMG thin film comprises tin(II) oxide (SnO) and has a glass-transition temperature of about 250° C. to about 400° C., and the SnO is oxidized into tin dioxide ($SnO_2$) on a surface of the LMG thin film by the radiating the energy beam in an oxygen-containing atmosphere.

10. The method of claim 9, wherein the LMG thin film further comprises at least one of $P_2O_5$, tungsten (W), boron (B), niobium (Nb), $TiO_2$, ZnO, $SiO_2$, BaO, $Al_2O_3$, and $B_2O_3$.

11. A method of manufacturing a sealing structure using a low melting material, comprising:
   disposing a low melting material to seal a sealing object disposed on a substrate, the low melting material having a transition temperature lower than a transition temperature of silicon dioxide ($SiO_2$); and
   radiating an energy beam onto the low melting material to heat an exposed surface of the low melting material to a heating temperature at or above the transition temperature of the low melting material,
   wherein the low melting material comprises a low melting glass (LMG) thin film,
   wherein the LMG thin film comprises tin(II) oxide (SnO) and has a glass-transition temperature of about 250° C. to about 400° C., and
   wherein the exposed surface of the LMG thin film is oxidized into tin dioxide ($SnO_2$) by the radiation of the energy beam in an oxygen-containing atmosphere.

12. The method of claim 11, wherein radiating the energy beam comprises controlling the heating temperature and a radiation time of the energy beam such that the radiation of the energy beam does not degrade or damage the sealing object.

13. The method of claim 11, wherein radiating the energy beam comprises controlling the heating temperature and a radiation time of the energy beam based on a metamorphic temperature of the sealing object.

14. The method of claim 11, wherein the sealing object comprises an organic light-emitting display device.

15. The method of claim 11, further comprising cooling the substrate.

* * * * *